United States Patent [19]

Votruba

[11] Patent Number: 4,990,850
[45] Date of Patent: Feb. 5, 1991

[54] METAL DETECTOR WITH TWO MAGNETIC FIELD TRANSDUCERS CONNECTED IN OPPOSING RELATIONSHIP AND THEIR SENSING DIRECTIONS ORTHOGONAL TO THE MAGNETIC FIELD

[75] Inventor: Jan V. Votruba, Port Jefferson Station, N.Y.

[73] Assignee: Fonar Corporation, Melville, N.Y.

[21] Appl. No.: 74,901

[22] Filed: Jul. 17, 1987

[51] Int. Cl.$^5$ .................. G01N 27/72; G01R 33/00; G01R 33/06; G08B 13/24

[52] U.S. Cl. .................. 324/225; 324/243; 324/251; 324/262; 340/551

[58] Field of Search .............. 324/225, 228, 241, 252, 324/251, 239, 243, 260, 262; 340/551

[56] References Cited

U.S. PATENT DOCUMENTS

| | | | |
|---|---|---|---|
| 3,419,798 | 12/1968 | Walton | 324/251 |
| 3,435,332 | 3/1969 | Kurdyla | 324/251 |
| 3,579,099 | 5/1971 | Kanbayashi | 324/235 |
| 3,619,769 | 11/1971 | Kusenberger et al. | 324/226 |

FOREIGN PATENT DOCUMENTS 2148597 11/1979 Japan .................. 324/241

Primary Examiner—Walter E. Snow
Attorney, Agent, or Firm—Lerner, David, Littenberg, Krumholz & Mentlik

[57] ABSTRACT

Apparatus and methods for monitoring a magnetic field and/or detecting ferromagnetic materials. Two transducers are disposed adjacent one another and arranged to provide signals directly related to magnetic field components in parallel but opposite sensing directions. Signal processing apparatus provides an output related to the difference between these two signals. The transducers may be oriented so that the sensing directions are transverse to the magnetic field and the output signal is substantially zero when the magnetic field is in a rest condition. When the magnetic field is disturbed, as by a ferromagnetic body, the output signal changes.

2 Claims, 2 Drawing Sheets

METAL DETECTOR WITH TWO MAGNETIC FIELD TRANSDUCERS CONECTED IN OPPOSING RELATIONSHIP AND THEIR SENSING DIRECTIONS ORTHOGONAL TO THE MAGNETIC FIELD

BACKGROUND OF THE INVENTION

The present invention pertains to apparatus and methods for monitoring magnetic fields and further pertains to apparatus and methods for detecting the presence of ferromagnetic materials.

There has been need heretofore for improved instruments and methods for monitoring magnetic phenomena. It is often desirable to monitor changes in the configuration of the magnetic field generated by nuclear magnetic resonance ("NMR") medical imaging equipment and the like. Also, ferromagnetic materials can impair operation of medical NMR instruments and may cause a safety hazard in operation of such instruments. Accordingly, there have been needs heretofore for practical instruments and methods to detect ferromagnetic materials.

Devices known as Hall effect transducers have been used heretofore for monitoring magnetic fields. A Hall effect device provides an electrical signal which typically varies directly with the magnitude of the magnetic field component in one direction along a predetermined sensing axis. An oppositely directed field component along the same axis will produce an opposite or inverse signal. Magnetic field components transverse to the sensing axis typically do not produce a signal Certain commercial Hall effect devices have been provided with ferromagnetic flux directing elements. For example, one Hall effect transducer commercially available under the designation Model BH-850 High Sensitivity Hall Generator available from the F.W. Bell Company of Orlando, Fla., includes a Hall effect device in conjunction with an elongated ferromagnetic bar. The axis of elongation of the bar is aligned with the sensing direction of the transducer. The flux directing element tends to strengthen the response of the transducer.

The low voltage signals typically provided by Hall effect devices have been amplified heretofore to provide useful output signal levels. However, magnetic field monitoring instruments utilizing Hall effect devices heretofore have been subject to undesirable phenomena such as thermal drift or changes in response of the instrument with temperature. Also, many of the magnetic field sensing devices available heretofore have been incapable of detecting small changes in the orientation of the magnetic field.

SUMMARY OF THE INVENTION

One aspect of the present invention provides improved apparatus for monitoring a magnetic field.

Apparatus according to this aspect of the present invention incorporates transducer means including a first transducer which produces a signal which is directly related to the magnetic field component in a first sensing direction. Most preferably, the transducer means also includes a second transducer disposed adjacent the first transducer, for producing a signal directly related to the magnetic field component in a second sensing direction opposite to the first sensing direction. Thus, a magnetic field component in the first sensing direction will increase the first signal and decrease the second signal, whereas a magnetic field component in the opposite or second direction will decrease the first signal but increase the second signal. The apparatus preferably also includes signal processing means for providing an output signal representative of the difference between the first and second signals and to provide an output signal directly related to this difference. Preferably, the signal processing means includes amplification means for amplifying one or more of the output signal, or the first and second signals.

Because the transducers are mounted adjacent one another, they are subject to substantially the same environmental conditions, such as temperature. Any spurious components in the first and second signals caused by environmental effects such as thermal drift will tend to cancel one another.

Most preferably, the apparatus includes mounting means arranged to hold the transducers so that the sensing directions are substantially perpendicular to the direction of the magnetic field prevailing when the magnetic field is in a reference or rest state. As the magnetic field component perpendicular to the sensing directions of the transducers does not produce a significant signal, the signal from each sensing element will be substantially zero while the magnetic field is in its reference or rest state. However, when the direction of the magnetic field changes, the magnetic field will have a component parallel to the sensing directions. Each sensing element therefore will generate a signal which represents the component parallel to the sensing direction. Thus, the signal from each sensing element will be representative only of the change in the field from its rest or reference state. Stated another way, the signals representing the change in the field will not be masked by a larger steady state signal. Thus, the signal processing means may include an amplifier with very high gain, to provide a large change in the output signal for even a small change in the direction of the magnetic field. As the output of the signal processing means represents the difference between the first and second signals, the first and second signals produced by the transducers upon any change in the field direction will reinforce one another. One of the signals will increase whereas the other will decrease upon any change in the magnetic field direction from the rest state.

A further aspect of the present invention provides apparatus for detecting the presence of ferromagnetic materials within a predetermined detection zone. Apparatus according to this aspect of the present invention preferably incorporates field producing means for providing a detection magnetic field extending through the detection zone, and incorporates apparatus as mentioned above for monitoring this detection magnetic field. The transducers preferably are mounted so that the sensing directions are substantially perpendicular to the direction of the detection magnetic field when there is no ferromagnetic material present in the detection zone. Under these conditions, the transducers will provide substantially no signal. However, any ferromagnetic material introduced into the detection zone will bend the detection field and hence will alter the direction of the field prevailing at the transducer. Because apparatus according to the preferred aspects of this invention can provide substantial output signals responsive even to minor changes in the direction of a magnetic field, the ferromagnetic material detection apparatus can detect even small amounts of ferromagnetic material within a detection zone of substantial dimensions.

The present invention also provides methods of monitoring magnetic fields and methods of detecting ferromagnetic materials. These methods preferably include the steps of operating a first transducer to provide a first signal directly related to the magnetic field component in a first sensing direction, operating a second transducer to provide a second signal directly related to the field component in a second, opposite sensing direction and providing an output signal related to the difference between these signals.

These and other objects, features and advantages of the present invention will be more readily apparent from the detailed description of the preferred embodiments set forth below taken in conjunction with the accompanying drawings.

DETAILED DESCRIPTION OF THE PREFERRED EMBODIMENTS

Figure 1:
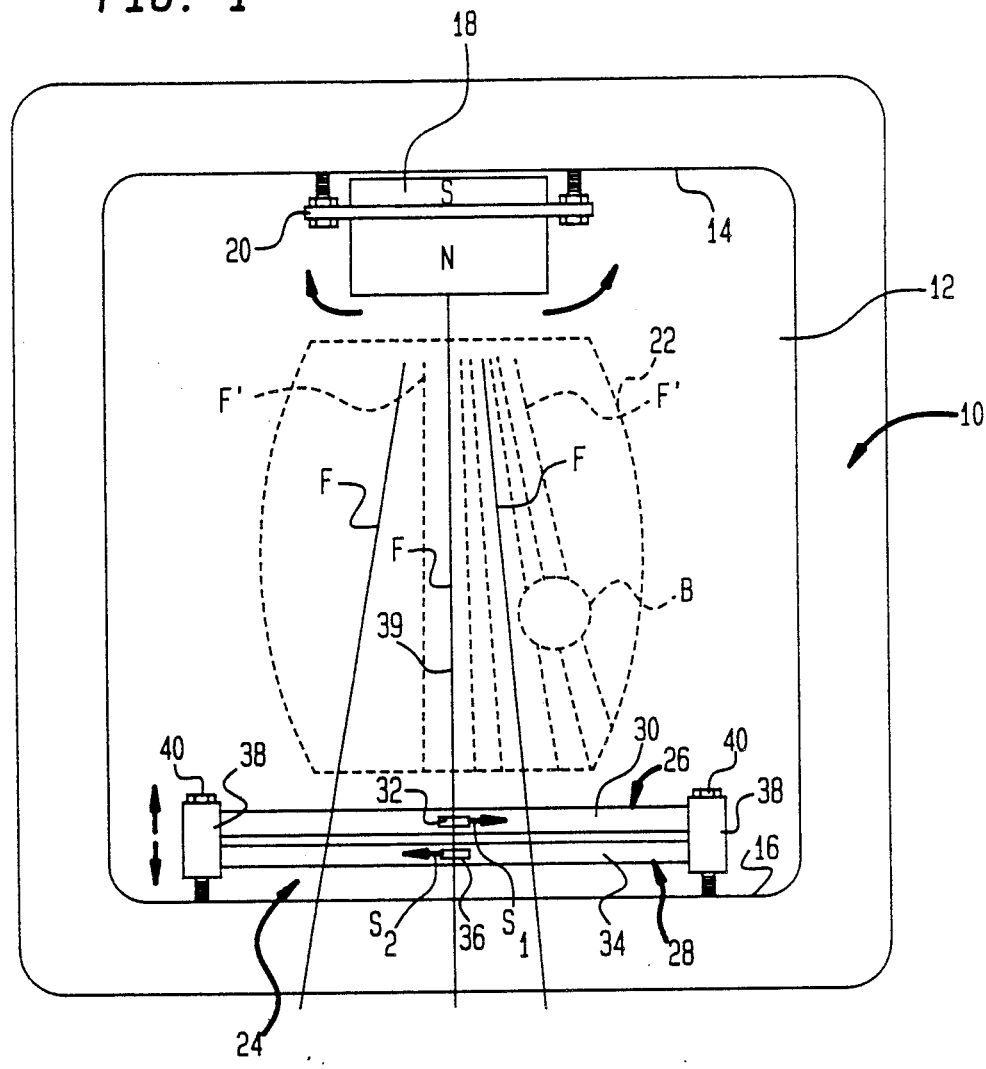
FIG. 1 is a schematic elevational view of apparatus according to one embodiment of the present invention.

Apparatus for detecting ferromagnetic materials according to one embodiment of the present invention includes a frame 10 having an opening 12 with two opposed sides 14 and 16. A permanent magnet 18 having north and south poles indicated by the letters N and S, respectively, is mounted to frame 10 adjacent side 14 by an adjustable mounting device 20 arranged so that the north pole of the magnet can be swung to the left or to the right as seen in FIG. 1 and locked in the desired position. Magnet 18 projects a magnetic field through opening 12 generally in the direction from side 14 to side 16 of the opening, so that the magnetic field passes through a predetermined detection zone 22 within opening 12.

Figure 3:
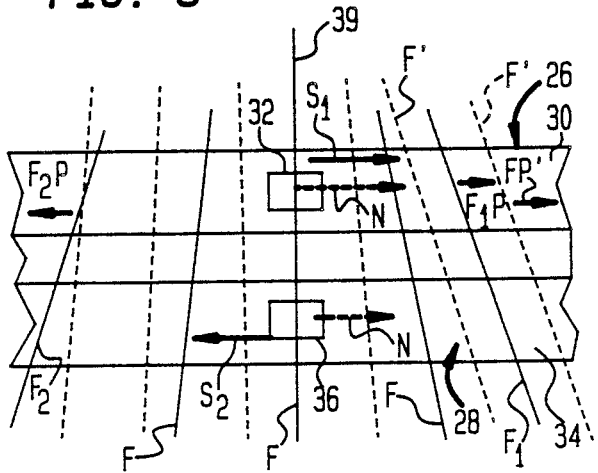
FIG. 3 is a fragmentary view depicting a portion of the apparatus shown in FIGS. 1 and 2.
Figure 2:
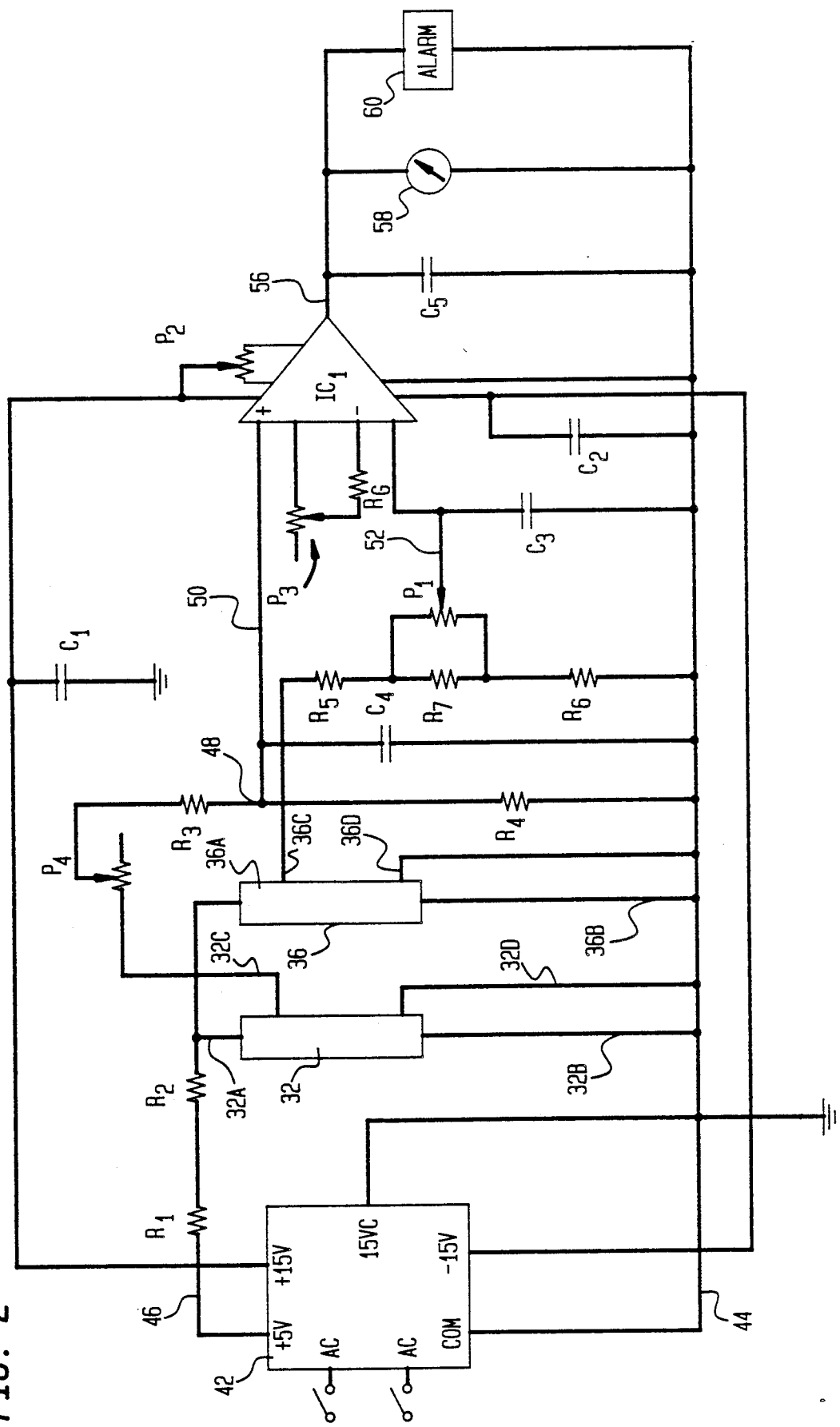
FIG. 2 is an electrical circuit diagram shown partially in block form, for the apparatus shown in FIG. 1.

A transducer assembly 24 includes a first transducer 26 and a second transducer 28. Transducer 26 includes an elongated ferromagnetic bar 30 and a Hall effect element 32 having leads $32a$–$32d$ (FIG. 2). Transducer 26 has a predetermined polarity That is, the physical arrangement of element 32 on bar 30 and the connection of the leads $32a$–$32d$ is such that when a positive control potential is applied, with control potential lead $32a$ positive with respect to control reference lead $32b$ and the magnetic field at sensing element 32 is oriented in the sensing direction indicated by vector $S_1$ (FIGS. 1 and 3) the Hall effect creates a positive potential on signal output lead $32c$ with respect to signal reference lead $32d$. Transducer 26, and magnetically sensitive element 32 thus provide a signal voltage which is directly related to the magnetic field in direction $S_1$. A magnetic field parallel to sensing direction $S_1$, but directed oppositely thereto (from the right to the left as seen in FIGS. 1 and 3) will induce a negative signal or Hall effect voltage, so that output lead $32c$ will go negative with respect to reference lead $32d$. Sensing direction $S_1$ is parallel to the longitudinal axis of bar 30. Transducer 26 is sensitive to magnetic field components in the longitudinal direction of the bar. The transducer is substantially insensitive to magnetic field components transverse to the sensing direction $S_1$ and transverse to the longitudinal axis of bar 30.

Second transducer 28 includes a bar 34 and a magnetically sensitive element 36, substantially the same as bar 30 and element 32, respectively. However, second transducer 28 is maintained in parallel but opposite orientation to first transducer 26 by transducer assembly frame 38. Thus, the longitudinal axis of bar 34 is parallel to the longitudinal axis of bar 30, whereas the sensing direction $S_2$ of second transducer 28 is parallel but opposite to the sensing direction $S_1$ of first transducer 26. With control potential lead $36a$ positive with respect to control reference lead $36b$, the Hall effect potential or output signal on lead $36c$ with respect to reference lead $36d$ will be directly related to the field in direction $S_2$. A field in the sensing direction indicated by $S_2$ will produce a positive voltage on output lead $36c$ with respect to reference lead $36d$, whereas a parallel but oppositely directed field (in direction $S_1$) will make lead $36c$ go negative with respect to lead $36d$.

Transducer assembly frame 38 maintains the transducers adjacent to one another and maintains bars 30 and 34 co-extensive wi&.h one another, so that the centers of the bars lie on a common plane 39 perpendicular to the lengthwise directions of the bars. The sensing elements of the transducers are exposed to substantially identical environmental conditions (such as temperature and stray electromagnetic radiation). Transducer assembly frame 38 is mounted to frame 10 by adjustable mounting elements arranged so that the longitudinal axes of bars 30 and 34, and hence the sensing directions of transducers 26 and 28, can be tilted with respect to side 16 of the frame and then locked into any selected position.

A power supply 42 (FIG. 2) is connected between a common lead 44 and a positive control voltage lead 46. Lead 46 is connected through resistors $R_1$ and $R_2$ to the control voltage leads $32a$ and $36a$ of magnetically sensitive elements 32 and 36, respectively. The control reference leads $32b$ and $36b$ are connected to common lead 44. The signal reference leads $32d$ and $36d$ of the magnetically sensitive elements are also connected to common lead 44. Signal output lead $32c$ of element 32 is connected through a potentiometer $P_4$ and resistors $R_3$ and $R_4$ back to common lead 4. Node 48 between resistors $R_3$ and $R_4$ is connected to the positive signal input of an integrated circuit differential amplifier $IC_1$ by a lead 50, there being a capacitor $C_4$ connected between lead 50 and common lead 44. Thus, signal output lead $32c$ is connected to the positive input terminal of amplifier $IC_1$ by an adjustable attenuation network, with AC filtering by capacitor $C_4$. Signal output lead $36c$ of element 36 is connected through resistors $R_5$, $R_7$ and $R_6$ to common lead 44. Potentiometer $P_1$ is connected in parallel with resistor $R_7$, and the variable tap 52 of potentiometer $P_1$ is connected to the negative input lead of amplifier $IC_1$. Thus, the signal output of the second transducer, from element 36 is connected via a further adjustable attenuation network to the negative input of amplifier $IC_1$. Capacitor $C_3$, connected between adjustable tap 52 and common lead 44, attenuates any AC signals on tap 52.

Amplifier $IC_1$ is provided with a gain adjusting variable resistive network including resistor $R_G$ and potentiometer $P_3$, and is powered by power supply 42. The power supply terminals of the amplifier are connected to positive and negative 15 volt outputs from power supply 42 there being an appropriate AC attenuation capacitor $C_1$ connected between one power supply lead and ground and $C_2$ connected between the opposite power supply lead and common lead 44. Amplifier $IC_1$ also has a reference connection to common lead 44 and an output bias adjustment apparatus including potentiometer $P_2$. A final AC attenuating capacitor $C_5$, a galvanometer 58 and a threshold detection and alarm device 60 are connected between the output lead 56 of amplifier $IC_1$ and common lead 44.

In a method of operation according to the present invention, magnet 18 provides a magnetic field extending across opening 12, from side 14 towards side 16 and through detection zone 22. As indicated by lines of flux F (solid lines) representing the field in this static or rest condition, the field in the vicinity of transducers 26 and 28 is substantially transverse to the longitudinal axes of bars 30 and 34, and hence transverse to sensing directions $S_1$ and $S_2$. The integral of the field vector taken over the length of each bar 30 and 34 has essentially no net component in direction $S_1$ or $S_2$. The field is substantially symmetrical about plane 39 and hence about the center of each bar. Although some of the lines of flux crossing the bars are not exactly transverse to the longitudinal axes of the bars and hence indicate some field component in the longitudinal direction along the bars, any such longitudinal component is balanced For example the longitudinal component $F_{1p}$ at flux line $F_1$ (FIG. 3) is balanced by equal and oppositely directed component $F_{2p}$ at line $F_2$. Therefore, there will be essentially no magnetic flux within either of bars 30 and 34 in their longitudinal directions and hence essentially no magnetic field in directions $S_1$ or $S_2$ at the magnetically sensitive elements 32 and 36. Therefore, the first signal passing from lead 32c to the positive input of amplifier $IC_1$ and the second signal passing from 36c to the negative input of amplifier $IC_1$ will be essentially zero. The difference between these two signals will also be essentially zero. As the output signal from amplifier $IC_1$ on lead 56 is directly proportional to this difference, the output signal will also be essentially zero.

If the magnetic field and the sensing directions $S_1$ and $S_2$ are not precisely orthogonal, as where magnet 18 or transducer assembly 24 are not in the proper alignment, there may be some minor amount of magnetic flux in one or another of the sensing directions $S_1$ or $S_2$ within bars 30 or 34 of the transducers. Where this flux is in direction $S_1$, the first signal on lead 32c fed into the positive input terminal of $IC_1$ will be positive, whereas the second signal negative. There will be an appreciable output signal at lead 56. Preferably, this condition is corrected by first adjusting the relative orientations of the sensing directions and the field, as by adjusting the position of magnet 18 by adjustment: mounting 20, adjusting the position of transducer assembly 24 by adjusting mounting 40, or both, so as to bring the sensing directions of the transducers into substantially exact orthogonal relation with the field and thus adjust both of the first and second signals from the transducers close to zero. Following this relatively coarse adjustment, potentiometers $P_4$ and $P_2$ can be used to bring the output signal even closer to zero. Potentiometer $P_1$ is then used for final adjustment.

When a ferromagnetic body such as the body B illustrated in broken lines in FIG. 1 enters detection zone 22, the magnetic field necessarily distorts to concentrate lines of flux within the ferromagnetic body. Therefore, the field is generally as indicated by lines flux F', shown in broken lines in FIGS. 1 and 3. As will be appreciated, the distorted field is not symmetrical with respect to central plane of bars 30 and 34. In the particular case shown, the field is distorted towards the right as seen in FIGS. 1 and 3. As the field is no longer symmetrical along the length of bars 30 and 34 the integral over the length of each bar of the field component $F'_p$ in the direction parallel to the sensing directions $S_1$ and $S_2$, is not zero. Rather, this integral amounts to a net field component N in the longitudinal directions, parallel to sensing directions $S_1$ and $S_2$.

Because bars 30 and 34 are disposed adjacent to one another, each will be subjected to substantially the same net field. As shown in FIG. 3, the net field N is co-directional with sensing direction $S_1$, but counterdirectional to sensing direction $S_2$. Therefore, the first signal fed from lead 32c to the positive input of amplifier $IC_1$ will go positive, where the second signal fed from lead 36c to the negative input of amplifier $IC_1$ will go negative. As the output of $IC_1$ is proportional to the difference between these two signals, both of these signals will tend to make the output signal at lead 56 go positive with respect to common lead 44. This change may be detected by monitoring galvanometer 58. Where the difference between the output signal on lead 56 and the reference voltage on common lead 44 exceeds a predetermined threshold, threshold detector 60 will emit an alarm signal.

As will be appreciated, the same but opposite action will occur where the field is distorted in the opposite direction, as by a ferromagnetic body positioned adjacent the left-hand side of detection zone 22. In this reverse case, the net magnetic field component within each of bars 30 and 34 will be co-directional with sensing direction $S_2$ and counterdirectional to $S_1$. Thus, the first signal from element 32 passing through the positive input of amplifier $IC_1$ will be negative, whereas the second signal from element 36 passing through the negative input of amplifier $IC_1$ will be positive Thus, the difference (first signal minus second signal) will be negatively signed, and hence the output at output lead 56 will also be negative Nonetheless, such negatively signed output will have substantial magnitude, and will be detected by threshold detector 60.

Because the transducers 26 and 28, and the magnetically sensitive elements 32 and 36 of the transducers are disposed adjacent to one another, the transducers will be exposed to substantially the same environmental conditions. Thus, spurious signals from magnetically sensitive elements 32 or 36 caused by environmental effects typically will be the same. As the signals from the elements are subtracted in differential amplifier $IC_1$, these effects will tend to cancel one another. Desirably, the attenuation networks associated with first signal output lead 32c and second signal output lead 36c are adjusted to provide substantially equal sensitivity on both branches of the circuit, so that for a given magnetic field the attenuated first and second signals fed into the positive and negative inputs of amplifier $IC_1$ via lead 50 and tab 52, respectively, will be of substantially equal magnitude (but opposite signs). Such balanced operation tends to promote accurate cancellation of spurious signals caused by environmental effects.

The apparatus and methods discussed above can be employed to detect ferromagnetic materials in or on substantially any object which can pass within the detection zone 22. For example, a medical patient can be screened to detect ferromagnetic implants, or the like, prior to subjecting that patient to nuclear magnetic resonance scanning procedures. The patient's body may be passed through the detection zone on a bed, stretcher or similar patient transport device (not shown). The same apparatus and methods can be employed to detect ferromagnetic materials in or on inanimate objects, such as ostensibly non-magnetic components for use in production of nuclear magnetic resonance scanners, or other magnetically sensitive applications.

Figure 4:
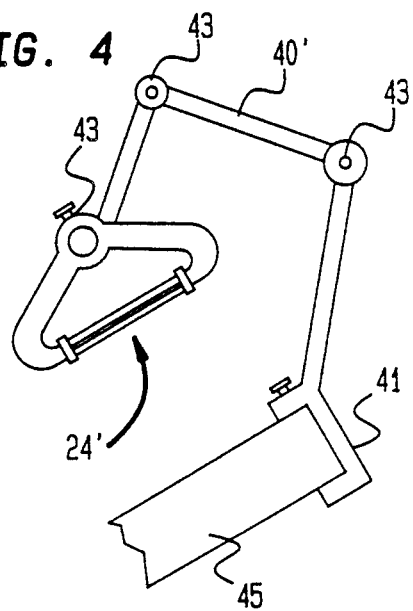
FIG. 4 is a fragmentary view of apparatus in accordance with a further embodiment of the invention.

Apparatus according to a further embodiment of the present invention, is illustrated in FIG. 4. The apparatus of FIG. 4 includes a transducer assembly 24', substantially identical to the transducer assembly discussed above, and includes a circuit as shown in FIG. 2. However, the apparatus does not include any permanent magnet or other device for generating a magnetic field. The transducer assembly mounting 40' includes a clamp or similar device 41 for mounting the transducer assembly in proximity to a separate machine 45 which generates a magnetic field, such as a magnetic resonance scanner. The mounting 40' also includes adjustable elements such as pivotal joints 43 for positioning the transducer assembly 24' so that the sensing directions are orthogonal to the magnetic field prevailing in the vicinity of the machine 45. In operation, the transducer assembly is operated and the output signal is nulled in substantially the same way as discussed above The output signal from the transducer assembly will indicate a change in direction of the magnetic field regardless of whether this change is caused by presence of ferromagnetic material in the vicinity of machine 45 or by some change in operation of the machine 45 itself. Where machine 45 generates significant, wide-ranging "fringe" fields extending to considerable distances from the machine, the transducer assembly 24' can be mounted at a significant distance from the machine. For example, the transducer assembly can be mounted on the wall of a room enclosing a medical NMR scanner and can detect the field distortion caused by ferromagnetic material approaching the room from the outside. Thus, apparatus according to this aspect of the invention can sound an alarm before a safety hazard occurs and before valuable data from an ongoing NMR scan is lost

EXAMPLE I

In one device according to the embodiment shown in FIGS. 1-3, the following components shown are employed:

| Component | Specification |
| --- | --- |
| Transducers 24 and 26 | BH-850 High Sensitivity Hall Generator (F. W. Bell Co.) |
| Amplifier IC$_1$ | 1N101 |
| R$_1$ | 220 ohm |
| R$_2$ | 10 ohm |
| R$_3$ | 10,000 ohm |
| R$_4$ | 10,000 ohm |
| R$_5$ | 10,000 ohm |
| R$_6$ | 10,000 ohm |
| R$_7$ | 20 ohm |
| R$_G$ | 2 ohm |
| P$_1$ | 0-20,000 ohm |
| P$_2$ | 0-100,000 ohm |
| P$_3$ | 0-100 ohm |
| P$_4$ | 0-1000 ohm |
| C$_1$ | 1 microfarads |
| C$_2$ | 1 microfarads |
| C$_3$ | 1 microfarads |
| C$_4$ | 1 microfarads |

-continued

| Component | Specification |
| --- | --- |
| C$_5$ | 100 microfarads |

The gain of amplifier IC$_1$ is adjustable from about 400 to 15,000. Magnet 18 is disposed about 25 cm. from the transducer assembly. The detection zone 22 is thus about 15 cm×20 cm. Ferromagnetic bodies as small as a 1 gram iron bar within zone 22 produce an output of about 0.05 volts at lead 56.

As will be appreciated, numerous variations and combinations of the features discussed above can be employed without departing from the present invention as defined in the claims. Merely by way of example, numerous alternative circuits including conventional bridge circuits and the like are known for developing an output proportional or otherwise related to the difference between signals. Accordingly, the foregoing description of the preferred embodiment should be taken by wall of illustration rather than by way of limitation of the invention as defined by the claims.

What is claimed is:

1. Apparatus for detecting the presence of ferromagnetic material in a predetermined detection zone comprising:
    magnetic field producing means for providing a detection magnetic field extending through said detection zone;
    transducer means including first and second transducers disposed adjacent one another for producing, respectively, a first signal directly related to the magnetic field component in a first sensing direction and a second signal directly related to the magnetic field component in a second sensing direction opposite to said first sensing direction, whereby an increase in magnetic field component in said first sensing direction will increase said first signal and decrease said second signal and whereby said first and second transducers will be exposed to substantially the same environmental conditions;
    signal processing means for providing an output signal related to the difference between said signals, said signal processing means including means for amplifying said first and second signals, said output signal or both;
    means for mounting said transducers so that said sensing directions are substantially orthogonal to the direction of a magnetic field prevailing in the vicinity of said transducers while said magnetic field is in a predetermined rest state, said mounting means including means for mounting said transducers so that said sensing directions are substantially orthogonal to said detection magnetic field in the absence of ferromagnetic material within said detection zone; and
    nuling means for adjusting said output signal to a predetermined null value when there is no ferromagnetic material in said detection zone, whereby a change in said output signal from said null value will indicate the presence of ferromagnetic material in said detection zone, said nulling means including means for adjusting said output signal to substantially a zero value and for adjusting the relative orientation of said transducers and said detection magnetic field.

2. Apparatus for detecting the presence of ferromagnetic material in a predetermined detection zone comprising:

magnetic producing means for providing a detection magnetic field extending through said detection zone;

transducer means including first and second transducers disposed adjacent one another for producing, respectively, a first signal directly related to the magnetic field component in a first sensing direction and a second signal directly related to the magnetic field component in a second sensing direction opposite to said first sensing direction, whereby an increase in magnetic field component in said first sensing direction will increase said first and second transducers will be exposed to substantially the same environmental conditions;

signal producing means for providing an output signal related to the difference between said signals;

means for mounting said transducers so that said sensing directions are substantially orthogonal to the direction of a magnetic field prevailing in the vicinity of said transducers while said magnetic field is in a predetermined rest state, said mounting means including means for mounting said transducers so that said sensing directions are substantially orthogonal to said detection magnetic field in the absence of ferromagnetic material within said detection zone; and a frame defining an opening encompassing said detection zone, said opening having a pair of opposed sides, said magnetic field producing means including means for providing said detection magnetic field so that said detection magnetic field is directed generally between said opposed sides, said mounting means including means for mounting said transducers adjacent one of said opposed sides.

* * * * *

UNITED STATES PATENT AND TRADEMARK OFFICE
CERTIFICATE OF CORRECTION

PATENT NO. : 4,990,850
DATED : February 5, 1991
INVENTOR(S) : Jan V. Votruba

It is certified that error appears in the above-identified patent and that said Letters Patent is hereby corrected as shown below:

Column 4, line 24, "wi&.h" should read --with--.

Column 4, line 46, "4" should read --44--.

Column 5, line 50, after "signal" insert --fed from lead 36c to the negative input terminal will be--.

Column 5, line 54, delete ":".

Column 9, line 15, after "said first" second occurrence, insert --signal and decrease said second signal and whereby said first--.

Signed and Sealed this

Seventeenth Day of November, 1992

Attest:

DOUGLAS B. COMER

Attesting Officer    Acting Commissioner of Patents and Trademarks